United States Patent [19]

Joergensen

[11] Patent Number: 4,578,670
[45] Date of Patent: Mar. 25, 1986

[54] ALARM SYSTEM FOR SAFEGUARDING AGAINST THE BREAK-THROUGH OF A SURFACE

[76] Inventor: Poul R. Joergensen, Strandvej 14, 4573 Hoejby Sjaelland, Denmark

[21] Appl. No.: 485,126
[22] PCT Filed: Jul. 6, 1982
[86] PCT No.: PCT/DK82/00063
  § 371 Date: Mar. 4, 1983
  § 102(e) Date: Mar. 4, 1983
[87] PCT Pub. No.: WO83/00246
  PCT Pub. Date: Jan. 20, 1983
[51] Int. Cl.$^4$ .............................................. G08B 13/08
[52] U.S. Cl. .................................................. 340/550
[58] Field of Search ........................................ 340/550

[56] References Cited

U.S. PATENT DOCUMENTS 3,594,770 7/1971 Ham et al. ............................ 340/550
3,725,891 4/1973 Miller ................................... 340/550
3,763,795 10/1973 Wetz, Jr. .............................. 340/550

Primary Examiner—Glen R. Swann, III
Attorney, Agent, or Firm—Finnegan, Henderson, Farabow, Garrett & Dunner

[57] ABSTRACT

An alarm system for safeguarding against the break-through of a wall includes a network of electrically conducting wires distributed over the wall and arranged to lie in at least two layers which are spaced a small distance from each other. The wires are comprised of a series consisting of a predetermined number of wires running uninterrupted through the layers with each wire having an input terminal in a corresponding output terminal. Some of the input terminals are provided with a first voltage or signal and other input terminals are provided with a second voltage or signal which is different from the first voltage or signal. An electronic device is connected to the output terminals for actuating an alarm when the voltage or signal on any one of the output terminals does not correspond to the voltage or signal on the corresponding input terminal.

11 Claims, 4 Drawing Figures

ALARM SYSTEM FOR SAFEGUARDING AGAINST THE BREAK-THROUGH OF A SURFACE

BACKGROUND OF THE INVENTION

1. Field of the Invention

This invention relates to an alarm system for the safeguarding against the breakthrough of a surface, for example a wall, the wall of a suitcase or a pane of glass, said system being of the kind where a pattern or network of electrical conducting wires or leads are distributed uniformly over the surface.

2. Description of the Related Art

With such known systems, where the leads lie in one layer, it is possible in principle for a criminal to remove a section of a lead after having short-circuited its ends with the help of a longer length of lead. In this manner it is possible with repeated operations in a chosen area to create an opening which is sufficiently large to enable stolen goods to be passed through.

The object of the present invention is to provide a construction without this drawback and, moreover, having several advantages.

SUMMARY OF THE INVENTION

The alarm system according to the invention is characterized in that the wires are arranged to lie in at least two surfaces, preferably plane surfaces lying at a small distance from each other seen at right angles to the surfaces, that the wires are comprised of a series consisting of the number n of wires, that this series runs uninterrupted through the surfaces so that the assembled network has the number n of input terminals and the number n of output terminals, that these terminals are connected to a current supply, a microprocessor or other electronics and an alarm in such a way that to a number of the wires n there are applied other voltages or signals in relation to the remainder, and that the microprocessor or the electronics unit is arranged to activate the alarm in the event that the voltage or the signals on just one of the output terminals does not correspond to the voltage or the signals on the corresponding input terminal.

By dimensioning such a system in a suitable manner, i.e. with conveniently close-lying wires seen both in the directions of the above-mentioned planes and at right angles thereto, it can be made very difficult to remove a section of a given wire without at the same time damaging the wires in another layer and thereby activating the alarm. It will be obvious that the breadth and the pattern or patterns of the wires can be varied quite considerably without deviating from the scope of the invention.

According to the invention, the individual surfaces can be connected in series, i.e. the series of wires runs first over the whole of the first surface, and from there further over the whole of the second and so on, hereby providing a very simple construction.

Moreover, according to the invention the series in the first surface can be laid out in a pattern in such a manner that the wires are parallel with each other over the greater part of the surface area, and that the same is the case for the following surface or surfaces, but that the wires from surface to surface form angles to each other, hereby further rendering a breakthrough difficult.

One embodiment of the system can be characterized by the wires being moulded into or enclosed in one or more insulating materials, for example by being laid out and secured on both sides of an insulating support layer and thereafter covered with an insulating covering material. There is hereby provided a finished product which can be dispatched without being damaged, and which thereafter can be mounted at the place of application.

A second embodiment can be characterized by an insulated support layer, composed of a so-called printboard, which is provided on both sides with a printed circuit and comprises two electrically connected wire surfaces, preferably connected in series. There is thus provided a construction which is not only simple to produce, but which also has the characteristics mentioned in connection with the foregoing embodiment. One can thus envision the insulating support layer as being wall decorating material, so that one can cover a whole wall with the support layer and then connect the individual sections of the material in series, and thereafter connect it to the remaining part of the system. In this way and with simple means it is thus possible to safeguard large wall areas and thereby safeguard complete rooms against break-in through the walls.

Further developments of this embodiment can be characterized in that the thickness of the printboard is less than 0.5 mm. What is obviously achieved hereby is a very flexible material, which while increasing the closeness of the individual wires in each surface to each other, increases the security against breakthrough.

The system according to the invention can be characterized by a series consisting of four wires. This provides many combinations for the application of voltages, signals or grounded connections to the individual wires.

Finally, the system can be characterized by a series of wires in which some are provided with one voltage and the remaining are provided with a second voltage which can be the grounded potential. This arrangement is a simple construction which allows operation of a binary system with constant voltages or no voltages throughout a section of the wires, and provides a simple building up of the system. In the case of the preferred embodiment, providing that there are four wires in a series, there is the possibility of 16 combinations of voltages or non-voltages on the wires.

BRIEF DESCRIPTION OF THE DRAWINGS

The invention will now be described in closer detail with reference to the accompanying drawings, where.

DESCRIPTION OF THE PREFERRED EMBODIMENT

Figure 1:
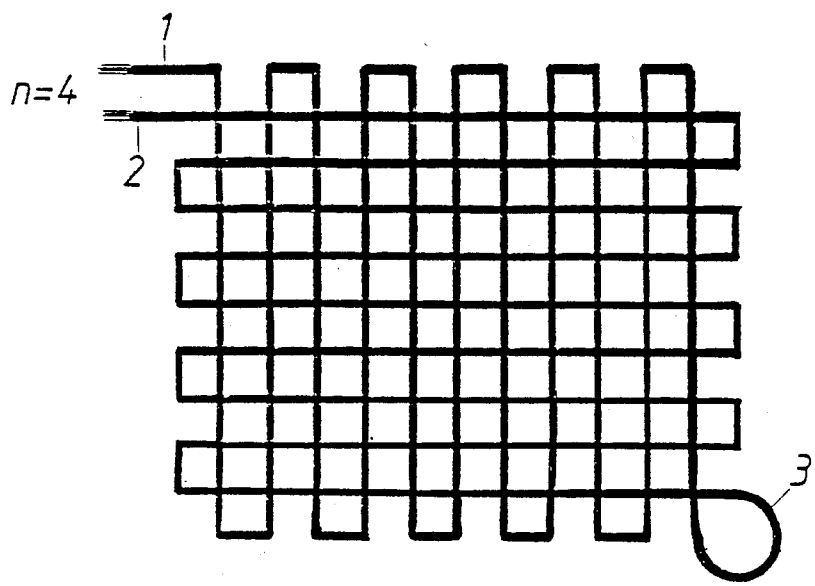
FIG. 1 shows in schematic form the run of a series of wires used in an alarm system according to the invention, but where for the sake of clarity the breadth of the series is greatly reduced.

In FIG. 1 the run of a series of wires is shown schematically by a broad black line. One end of the series is shown at 1 and the other end at 2. The series consists of 4 wires. It is understood that the term wires is used to designate any kind of electrical conductor. For the sake of clarity, the four wires are shown as a broad black line. However, in practice the distance between the individual parts of the series in the places where it runs parallel to itself is just as small as the distance between the individual wires. The first part of the series, which principally consists of vertical lines, is mounted on one side of a support layer, for example in the form of a printed circuit on a printboard, while the second part of the series, which principally consists of horizontal lines is mounted on the other side of the support layer. The transition from one side to the other takes place at the loop 3. This transition is to be considered schematic. In practice it could be executed in another manner. The support layer or the printboard can then be secured to or comprise a part of a wall in a suitcase or a strongbox, in that all of the wall surface is then covered.

Figure 2:
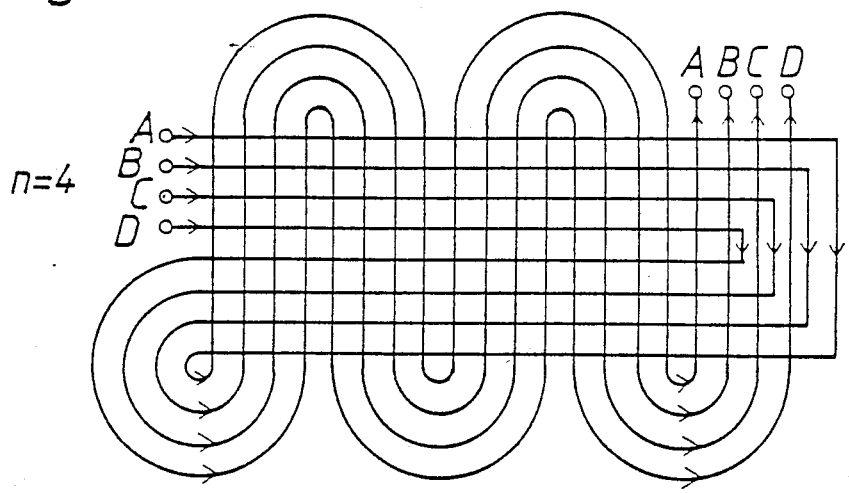
FIG. 2 shows in more detail the actual mutual distance between the wires, but where the effective barrier area of the wire network is reduced for clarity.

As mentioned, the parallel parts of the series 1 lie closer to each other than shown in FIG. 1. FIG. 2 shows a more realistic distance between the wires, where all the wires comprising the system lie at the same distance from each other in a square net. On the other hand, the effective barrier area in this schematic arrangement is very small in relation to the ineffective fringe area, which in practice does not occupy so much space.

Figures 3, 4:
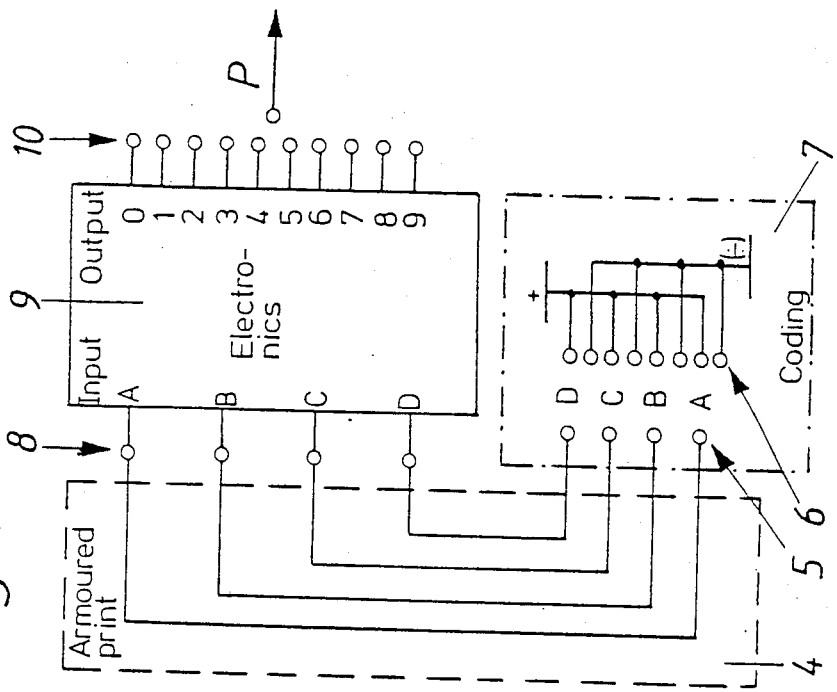
FIG. 3 shows a coupling diagram for an alarm system according to the invention.
FIG. 4 is a table showing the relationship between input and output with regard to FIG. 3.

FIG. 3 shows a coupling diagram with a support layer or armoured print 4 symbolized by a dotted line, and which contains the arrangement of FIGS. 1 and 2. Four input terminals 5 can be connected to the terminals 6 in a power source 7. Every second of these terminals 6 are live, while the others are connected to ground. For a given production example a binary coding is produced by connecting some of the input terminals 5, to a live terminal, while the remainder are connected to ground. The output terminals 8 on the support layer or the armoured print 4 are connected to a microprocessor or an electronic unit 9 containing generally known electronics capable of distinguishing between the possible combinations. In this embodiment, electronic unit 9 is a decoder including a binary to decimal converter in which a binary input on terminals 8 produces a decimal output on terminals 10. In the event that the output 8 of armoured print 4 at 5 and 6 the output of terminals 10 would also change to actuate an alarm symbolized by the arrow P.

FIG. 4 shows the possible combinations. For a given production example one chooses to use only one of the possible combinations. For example one can decide that the terminals A and B are to be current-carrying, while the remainder are to be connected to ground. This corresponds to line 4 in the table in FIG. 4, where 1 signifies current-carrying and 0 signifies connection to ground. The electronic unit 9 of FIG. 3 includes a decoder which can accomodate 10 combinations. It is also possible to use a decoder of the same design which can accomodate all 16 combinations. The invention is naturally not limited to the use of four wires in a series, but in practice it has been proven that four wires and ten combinations are more than sufficient to provide the desired protection. With the example mentioned, the protection is thus achieved by a voltage being applied by electronic unit 9 to terminal 3 in the row 10, while the other terminals remain voltage-free in relation to ground. The system is arranged to provide an alarm signal at the instant that this is not the case. For instance, terminal 3 in row 10 can be connected to a relay switch which closes to supply electricity to actuate an alarm when voltage is not supplied to terminal 3 in row 10. Thus, the alarm signal is produced when, (1) one of the current-carrying wires A or B is cut,
(2) one of the current-carrying wires is connected to something which diverts the current, including for example one of the remaining leads,
(3) a voltage is applied to one of the leads connected to earth.

As the wires in the support layer as shown in FIGS. 1 and 2 can be arranged to lie very close to one another, and since a criminal attempting to break through cannot know which of the wires are current-carrying and which are not, it becomes impossible in practice to make holes in the support layer which are substantially larger than the size of the mesh.

What is claimed is:

1. An alarm system for safeguarding against the breakthrough of a wall comprising:
a network of electrically conducting wires distributed over the wall and arranged to lie in at least two layers which are spaced a small distance from each other; said wires comprised of a group consisting of a predetermined number of wires running uninterrupted through the layers; each wire having an input terminal and a corresponding output terminal; the input terminals provided with respective set input voltages or signals; the respective set input voltages or signals producing corresponding set output voltages or signals on corresponding output terminals when the alarm system is set and unactivated; at least one of the input terminals being provided with a set input voltage or signal which is different from the set input voltage or signal of at least one of the other input terminals; and electronic means connected to the output terminals for activating an alarm when the output voltage or signal on at least one of the output terminals does not correspond to the set output voltage for that terminal.

2. A system according to claim 1 wherein the wires in each layer are connected in series to the wires in at least one other layer so that the group of wires runs first over the whole of a first layer and from there runs over the whole of another layer.

3. A system according to claim 1 wherein the wires in each layer are parallel with the wires within the layer over the greater part of the surface area but are positioned at angles to wires in at least one other layer.

4. A system according to claim 1 wherein the wires are at least partially surrounded by an insulating material.

5. A system according to claim 1, including an insulating printboard support layer, said insulating support layer including a printed circuit on each side to comprise two electrically connected wire surfaces connected in series.

6. A system according to claim 5 wherein the printboard is less than 0.5 mm thick.

7. A system according to claim 1 wherein the distance between the individual wires in each layer is less than 5 mm.

8. A system according to claim 1 wherein the group is comprised of four wires.

9. A system according to claim 1 wherein the input terminal of each wire has either the same voltage as the first of said input terminals or the same voltage as the second of said input terminals.

10. A system according to claim 1 wherein the wires are uniformly distributed over said wall.

11. A system according to claim 10 wherein the electronic means includes means for converting a binary input received from the output terminals into a non-binary output.

* * * * *